United States Patent
Wang

(10) Patent No.: US 10,345,382 B2
(45) Date of Patent: Jul. 9, 2019

(54) METHOD AND TERMINAL FOR DISPLAYING BATTERY POWER

(71) Applicant: Huawei Device Co., Ltd., Dongguan (CN)

(72) Inventor: Guanglin Wang, Shanghai (CN)

(73) Assignee: HUAWEI DEVICE CO., LTD., Dongguan (CN)

( * ) Notice: Subject to any disclaimer, the term of this patent is extended or adjusted under 35 U.S.C. 154(b) by 654 days.

(21) Appl. No.: 14/569,843

(22) Filed: Dec. 15, 2014

(65) Prior Publication Data

US 2015/0100261 A1  Apr. 9, 2015

Related U.S. Application Data

(63) Continuation of application No. PCT/CN2013/090618, filed on Dec. 27, 2013.

(30) Foreign Application Priority Data

Dec. 28, 2012 (CN) .......................... 2012 1 0587109

(51) Int. Cl.
  *G01R 31/36* (2019.01)
  *G01R 31/371* (2019.01)
  (Continued)

(52) U.S. Cl.
  CPC ..... *G01R 31/3646* (2019.01); *G01R 31/3648* (2013.01); *G01R 31/371* (2019.01); *G01R 31/382* (2019.01); *G01R 31/3842* (2019.01)

(58) Field of Classification Search
  CPC ............ G01R 31/3624; G01R 31/3606; G01R 31/3648; G01R 31/3675; G01R 31/3682;
  (Continued)

(56) References Cited

U.S. PATENT DOCUMENTS 4,725,784 A * 2/1988 Peled ................. G01R 31/3648
  320/149
5,834,922 A * 11/1998 Ikawa ................. B60L 11/1864
  320/136
(Continued)

FOREIGN PATENT DOCUMENTS

CN  1715944 A  1/2006
CN  101138142 A  3/2008
(Continued)

OTHER PUBLICATIONS

Foreign Communication From a Counterpart Application, European Application No. 13869005.2, Extended European Search Report dated Jun. 3, 2015, 8 pages.
(Continued)

*Primary Examiner* — Kenneth Parker
*Assistant Examiner* — Steven B Gauthier
(74) *Attorney, Agent, or Firm* — Conley Rose, P.C.

(57) ABSTRACT

A method and a related terminal for displaying battery power to improve accuracy of displaying battery power. The method includes acquiring a power increase of a battery according to a preset time interval when the battery enters a charging state, where the battery has completed discharging before entering the charging state, acquiring power stored in the battery and an open circuit voltage OCV of the battery at a time when the acquired power increase of the battery reaches a preset threshold, generating an Open Circuit Voltage-State Of Capacity (OCV-SOC) curve according to the acquired power stored in the battery and the acquired OCV when the battery completes charging, and displaying the battery power according to the generated OCV-SOC curve.

13 Claims, 3 Drawing Sheets

(51) Int. Cl.
*G01R 31/382* (2019.01)
*G01R 31/3842* (2019.01)

(58) Field of Classification Search
CPC .............. G01R 31/3689; G01R 31/361; G01R 31/3651; H02J 7/0021
See application file for complete search history.

(56) References Cited

U.S. PATENT DOCUMENTS

| | | | | |
|---|---|---|---|---|
| 6,366,054 | B1* | 4/2002 | Hoenig | G01R 31/3631 320/132 |
| 8,198,863 | B1* | 6/2012 | Wortham | G01R 31/3624 320/132 |
| 2003/0112011 | A1* | 6/2003 | Guiheen | G01R 31/3624 324/429 |
| 2006/0170426 | A1 | 8/2006 | Atehortua et al. | |
| 2006/0202663 | A1 | 9/2006 | Cho | |
| 2008/0077338 | A1* | 3/2008 | Wong | G01R 31/361 702/63 |
| 2009/0322283 | A1* | 12/2009 | Zhang | G01R 31/3624 320/134 |
| 2013/0204561 | A1* | 8/2013 | Daiss | G01R 31/362 702/63 |

FOREIGN PATENT DOCUMENTS

| | | |
|---|---|---|
| CN | 101153894 A | 4/2008 |
| CN | 102753985 A | 10/2012 |
| EP | 1953559 A2 | 8/2008 |
| JP | 2002286818 A | 10/2002 |
| KR | 20120082965 A | 7/2012 |
| WO | 0242786 A2 | 5/2002 |

OTHER PUBLICATIONS

Partial English Translation and Abstract of Chinese Patent Application No. CN1715944A, Dec. 31, 2014, 11 pages.
Foreign Communication From a Counterpart Application, PCT Application No. PCT/CN2013/090618, English Translation of International Search Report dated Mar. 27, 2014, 3 pages.
Foreign Communication From a Counterpart Application, PCT Application No. PCT/CN2013/090618, Written Opinion dated Mar. 27, 2014, 6 pages.

* cited by examiner

METHOD AND TERMINAL FOR DISPLAYING BATTERY POWER

CROSS-REFERENCE TO RELATED APPLICATIONS

This application is a continuation of international Application No. PCT/CN2013/090618, filed on Dec. 27, 2013, which claims priority to Chinese Patent Application No. 201210587109.0, filed on Dec. 28, 2012, both of which are hereby incorporated by reference in their entireties.

TECHNICAL FIELD

The present invention relates to the field of electronic technologies, and in particular, to a method and a terminal for displaying battery power.

BACKGROUND

With the development of electronic information technologies, a large number of portable terminals such as mobile phones and notebook computers emerge. People need to monitor battery power of a terminal, so as to properly manage power energy.

Battery power display is an important matter in an intelligent terminal. At present, most terminals estimate corresponding remaining battery power by measuring a battery voltage. A scale-division reference, which is similar to common rough power display on a mobile phone, is obtained according to a correspondence between a battery voltage and a battery capacity. Such a scale-division power display manner is too rough and display is often inaccurate, especially for a battery having been used for a long time. For example, after a battery is used for more than hundreds of times in a circular manner, the battery becomes aged. Even if scale-division display of power is full, the battery cannot be used for enough time because after the battery is aged, a battery capacity represented by a same voltage of the battery changes and a corresponding battery capacity becomes smaller, which causes a great difference between displayed power and actual battery power. A mobile phone may be automatically powered off when 20% or even a higher percentage of power is displayed. After a battery is aged, a capacity of the battery becomes smaller, but a capacity percentage is acquired still according to a table in a normal state, which causes a great trouble to user experience.

SUMMARY

Embodiments of the present invention provide a method and a related terminal for displaying battery power, so as to improve accuracy of displaying battery power.

To solve the foregoing technical problem, the following technical solutions are provided in the embodiments of the present invention.

According to a first aspect, an embodiment of the present invention provides a method for displaying battery power, including acquiring a power increase of a battery according to a preset time interval when the battery enters a charging state, where the battery has completed discharging before entering the charging state, acquiring power stored in the battery and an open circuit voltage (OCV) of the battery at a time when the acquired power increase of the battery reaches a preset threshold, generating an Open Circuit Voltage-State Of Capacity (OCV-SOC) curve according to the acquired power stored in the battery and the acquired OCV when the battery completes charging, and displaying the battery power according to the generated OCV-SOC curve.

With reference to the first aspect, in a first possible implementation manner of the first aspect, the acquiring power stored in the battery and an OCV of the battery at a time when the acquired power increase of the battery reaches a preset threshold includes detecting a voltage and a current of the battery at the time when the acquired power increase of the battery reaches the preset threshold, accumulating the power increase of the battery to obtain the power stored in the battery at the time, and calculating the OCV of the battery at the time according to the voltage and the current of the battery.

With reference to the first aspect or the first possible implementation manner of the first aspect, in a second possible implementation manner, the generating an OCV-SOC curve according to the acquired power stored in the battery and the acquired OCV includes calculating a total capacity of the battery in a current situation according to the power stored in the battery, dividing the total capacity of the battery into multiple power levels, and establishing a mapping relationship between each power level and an OCV that is separately corresponding to each power level, to generate the OCV-SOC curve.

With reference to the first aspect or the first possible or second possible implementation manner of the first aspect, in a third possible implementation manner of the first aspect, the method further includes if charging is interrupted in midway after the battery enters the charging state or if charging time exceeds a charging time limit, displaying the battery power by using an OCV-SOC curve saved in a terminal to which the battery belongs.

With reference to the first aspect or the first possible or second possible implementation manner of the first aspect, in a fourth possible implementation manner of the first aspect, the method further includes acquiring a temperature parameter of the battery when the battery is in a charging process, and after generating the OCV-SOC curve according to the acquired power stored in the battery and the acquired OCV, using the generated OCV-SOC curve to replace an OCV-SOC curve that is saved in a terminal to which the battery belongs and corresponding to the temperature parameter.

According to a second aspect, an embodiment of the present invention further provides a terminal for displaying battery power, including a first acquiring unit configured to acquire a power increase of a battery according to a preset time interval when the battery enters a charging state, where the battery has completed discharging before entering the charging state, a second acquiring unit configured to acquire power stored in the battery and an OCV at a time when the power increase of the battery acquired by the first acquiring unit reaches a preset threshold, a generating unit configured to, when the battery completes charging, generate an OCV-SOC curve according to the power stored in the battery and the OCV that are acquired by the second acquiring unit, and a displaying unit configured to display the battery power according to the OCV-SOC curve generated by the generating unit.

With reference to the second aspect, in a first possible implementation manner of the second aspect, the second acquiring unit includes a detecting subunit configured to detect a voltage and a current of the battery at the time when the acquired power increase of the battery reaches the preset threshold, a first calculating subunit configured to accumulate the power increase of the battery acquired by the first acquiring unit, to obtain the power stored in the battery at the time, and a second calculating subunit configured to calculate the OCV of the battery at the time according to the voltage and the current of the battery that are detected by the detecting subunit.

With reference to the second aspect or the first possible implementation manner of the second aspect, in a second possible implementation manner of the second aspect, the generating unit includes a third calculating subunit configured to calculate a total capacity of the battery in a current situation according to the power stored in the battery, a dividing subunit configured to divide the total capacity of the battery that is calculated by the third calculating subunit into multiple power levels, and a mapping subunit configured to establish a mapping relationship between each power level obtained by means of division by the dividing subunit and an OCV that is separately corresponding to each power level, to generate the OCV-SOC curve.

With reference to the second aspect or the first possible or second possible implementation manner of the second aspect, in a third possible implementation manner of the second aspect, the displaying unit is further configured to, if charging is interrupted in midway after the battery enters the charging state or if charging time exceeds a charging time limit, display the battery power by using an OCV-SOC curve saved in a terminal to which the battery belongs.

With reference to the second aspect or the first possible or second possible implementation manner of the second aspect, in a fourth possible implementation manner of the second aspect, the terminal further includes an acquiring unit configured to acquire a temperature parameter of the battery when the battery is in a charging process, and a replacing unit configured to use the OCV-SOC curve generated by the generating unit to replace an OCV-SOC curve that is saved in a terminal to which the battery belongs and corresponding to the temperature parameter.

It can be seen from the foregoing technical solutions that the embodiments of the present invention have the following advantages. In the embodiments provided in the present invention, after completing discharging, a battery enters a charging state until charging is completed. In a process from no stored power to fully charged power, a power increase of the battery is acquired according to a preset time interval; power stored in the battery and an OCV are acquired when the acquired power increase of the battery reaches a preset threshold. After the charging is completed, an OCV-SOC curve for a current storage capacity of the battery is generated and the battery power is displayed by using the generated OCV-SOC curve. According to the method for displaying battery power provided in the embodiments of the present invention, even if the battery is aging, the OCV-SOC curve generated according to the current storage capacity of the battery can still display current battery power correctly without being affected by battery aging, and therefore a deviation of power displaying is not caused.

BRIEF DESCRIPTION OF DRAWINGS

To describe the technical solutions in the embodiments of the present invention more clearly, the following briefly introduces the accompanying drawings required for describing the embodiments. The accompanying drawings in the following description show merely some embodiments of the present invention, and a person skilled in the art may still derive other drawings from these accompanying drawings.

DESCRIPTION OF EMBODIMENTS

Embodiments of the present invention provide a method and a terminal for displaying battery power to improve accuracy of displaying the battery power.

To make the objectives, features, and advantages of the embodiments of the present invention clearer, the following clearly describes the technical solutions in the embodiments of the present invention with reference to the accompanying drawings in the embodiments of the present invention. The described embodiments are merely a part rather than all of the embodiments of the present invention. All other embodiments obtained by a person skilled in the art based on the embodiments of the present invention shall fall within the protection scope of the present invention.

Figure 1:
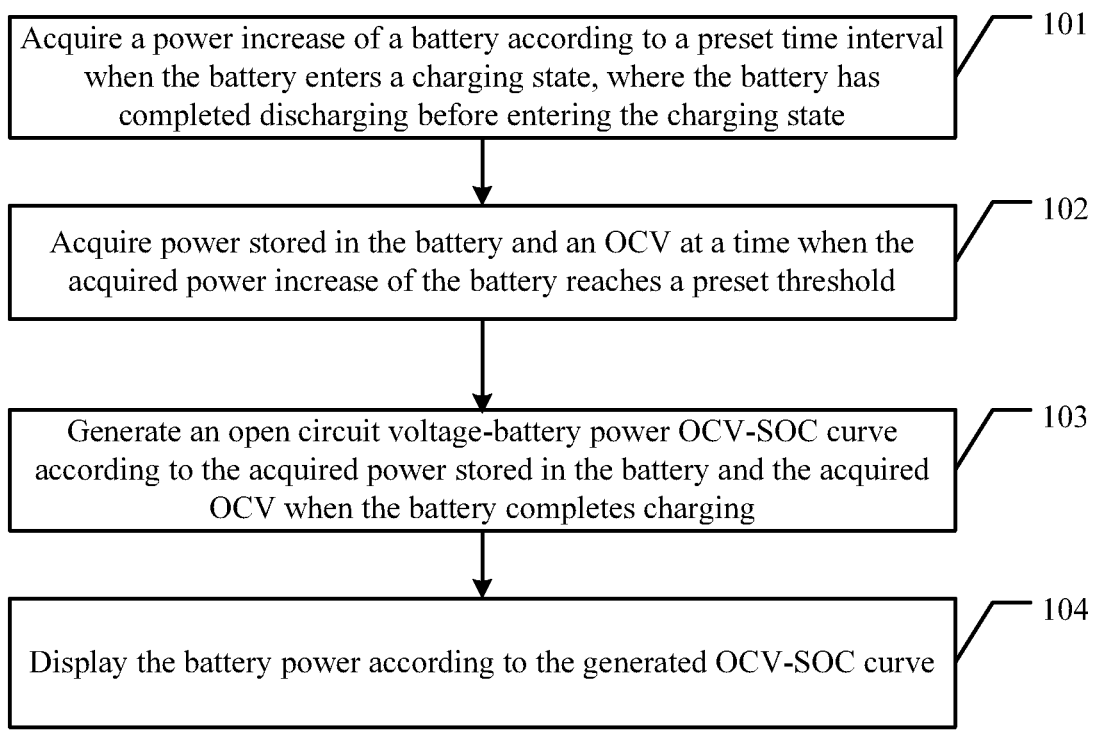
FIG. 1 is a schematic block flowchart of a method for displaying battery power according to an embodiment of the present invention.

An embodiment of the present invention provides a method for displaying battery power, and as shown in FIG. 1, the method includes the following steps.

101. Acquire a power increase of a battery according to a preset time interval when the battery enters a charging state, where the battery has completed discharging before entering the charging state.

In this embodiment of the present invention, the battery is first discharged completely, and discharging is completed in a preset period of time. Before the discharging is completed, no charger or universal serial bus (USB) is plugged, which prevents the battery from entering the charging state. The battery is charged after the discharging is completed, and only in this case the battery enters the charging state.

When the battery enters the charging state, a power increase of the battery is acquired according to a preset time interval. That is, the power increase of the charged battery is acquired at the preset time interval. How much power of the battery is charged is determined at a particular moment (for example, a moment when a first preset time interval from the beginning of charging arrives, or a moment when any preset time interval arrives before the charging is completed). In a practical application, charged power may be calculated at every preset time interval by means of timer triggering, so that the power increase of the battery can be acquired in the preset time interval. In a management module of the battery, there is a task that can monitor a status of the battery in real time, and a timer may be added in a monitoring task. For example, the preset time interval is three seconds or a shorter time. Using three seconds as an example, the timer may trigger real-time calculation every three seconds to calculate charged power at this time, so that the power increase of the battery is acquired. The charged power may be specifically calculated by using a coulomb meter, so as to obtain the charged power of the battery.

It should be noted that in this embodiment of the present invention, to execute the method provided in this embodiment of the present invention, charging cannot be interrupted since the battery enters the charging state. Otherwise, a terminal for displaying the battery power cannot continue to execute subsequent steps to generate an OCV-SOC curve. Preferably, to continue to display the battery power, if charging is interrupted in midway after the battery enters the charging state or if charging time exceeds a charging time limit, the battery power is displayed by using an OCV-SOC curve saved in a terminal to which the battery belongs. An OCV-SOC curve initially configured in the terminal is an original open circuit voltage-state of capacity curve, which is an initial configuration of the terminal at delivery. Each time when a new OCV-SOC curve is generated, a previously saved OCV-SOC curve is replaced to ensure accuracy of displaying the battery power. In addition, the charging time limit may generally be set flexibly, for example, the charging time limit is set to 24 hours, 36 hours, or 48 hours. In this embodiment of the present invention, when the battery cannot ensure that a process from completion of discharging to completion of charging is completed once, an OCV-SOC curve (which may be the original OCV-SOC curve, or may be an OCV-SOC curve generated last time) saved in the terminal is used to display the battery power. This is also for better compatibility with an application scenario in which complete charging cannot be implemented.

102. Acquire power stored in the battery and an OCV at a time when the acquired power increase of the battery reaches a preset threshold.

In this embodiment of the present invention, the power increase of the battery is acquired according to the preset time interval in step 101, and when the power increase of the battery meets a condition of the preset threshold, the power stored in the battery and the OCV are acquired at this time. For example, the preset threshold may be set to 3 mAh or 5 mAh, that is, each time when an increase of charged power reaches 3 mAh, power stored in the battery and an OCV at this time are calculated and acquired, and power stored in the battery and OCVs that are acquired for multiple times may be saved in a table. The power increase of the battery refers to an increase of power stored in the battery when the battery is charged.

It should be noted that, as one of implementable manners, acquiring the power stored in the battery and the OCV of the battery at the time when the acquired power increase of the battery reaches the preset threshold may specifically include the following steps.

A1. Detect a voltage and a current of the battery at the time when the acquired power increase of the battery reaches the preset threshold.

A2. Accumulate the power increase of the battery to obtain the power stored in the battery at the time.

A3. Calculate the OCV of the battery at the time according to the voltage and the current of the battery.

For step A1, when the power increase of the battery reaches the preset threshold, the voltage and the current of the battery at this time are detected to obtain a voltage signal value and a current signal value of the battery. In step A2, the power increase of the battery may be calculated in an accumulated manner by using a coulomb meter, so that the power stored in the battery at this time may be obtained. For example, each time when the charged power increases by 3 mAh, the charged power calculated in step 101 is accumulated, so that how much power of the battery is charged at this time can be obtained. In step A3, after the voltage and the current of the battery are acquired, the OCV is calculated according to the voltage and the corresponding current. For an implementation manner of step A3, calculation may be performed in the following manner: $Vbat=OCV+I*R$.

Vbat is the voltage detected by means of step A1, and I is the current detected by means of step A1. Two groups of voltage and current are detected by consecutively executing step A1 twice: Vbat1 and I1, and Vbat2 and I2; then, an equation set may be obtained by using the foregoing formula, so that a value of OCV and a value of R may be worked out, where R is internal resistance of the battery.

It should be noted that step 102 in this embodiment of the present invention needs to be repeatedly executed for multiple times, and this step is executed as long as a condition that the power increase of the battery reaches the preset threshold is met. Multiple calculation results may be obtained by multiple executions, and the calculation results are saved in a table.

103. Generate an OCV-SOC curve according to the acquired power stored in the battery and the acquired OCV when the battery completes charging.

In this embodiment of the present invention, it needs to determine whether the battery completes charging. If yes, step 103 is executed.

It should be noted that there may be multiple implementation manners for determining whether the battery completes charging, and the implementation manners may specifically include determining whether a voltage of the battery reaches a preset voltage, where if the voltage of the battery reaches the preset voltage, the battery completes charging, or determining whether the power stored in the battery reaches preset power, where if the power stored in the battery reaches the preset power, the battery completes charging.

It should be noted that a preset voltage may be set for a battery. For a battery in a mobile phone terminal, a preset voltage may generally be set to 4.2V. When a voltage of a battery of a mobile phone reaches 4.2V, it may indicate that the battery completes charging. In a practical application, a preset voltage may be set according to a type of a terminal, for example, the preset voltage is set to 3.5V or 10.8V, which is only used for description but not for limitation herein. Preset power may further be set for the battery. As long as power stored in the battery reaches the preset power, it may be considered that the battery completes charging.

It should be noted that in this embodiment of the present invention, preferably, the method provided in this embodiment of the present invention may further include that if the battery does not complete charging, an execution of acquiring the power stored in the battery and the OCV at the time when the power increase of the battery reaches the preset threshold needs to be triggered for multiple times. That is, step 102 needs to be repeatedly executed when the battery does not complete charging, so that power stored in the battery is calculated for multiple times and an OCV corresponding to each stored power is calculated.

In this embodiment of the present invention, after the battery completes charging, the OCV-SOC curve may be generated according to the acquired power stored in the battery and the acquired OCV. Then, an OCV-SOC curve generated based on the power stored in the battery that is calculated for multiple times and multiple corresponding OCVs can represent power stored in the battery in a current situation, where the power stored in the battery that is calculated for multiple times and multiple corresponding OCVs are acquired in the foregoing step. Especially when the battery is aging, a battery capacity decline and an increase of battery internal resistance may usually be caused. Therefore, the OCV-SOC curve (which may be the original OCV-SOC curve, or may be the OCV-SOC curve generated last time) saved in the terminal may not represent an actual power storage capacity of the battery itself in the current situation. However, the OCV-SOC curve generated by using the method provided in this embodiment of the present invention can indicate a current actual capacity of the battery.

It should be noted that, as one of implementable manners, generating the OCV-SOC curve according to the acquired power stored in the battery and the acquired OCV may specifically include the following.

B1. Calculate a total capacity of the battery in a current situation according to the power stored in the battery.

B2. Divide the total capacity of the battery into multiple power levels.

B3. Establish a mapping relationship between each power level and an OCV that is separately corresponding to each power level, to generate the OCV-SOC curve.

For step B1, when the battery has completed charging, power stored in the battery at this time is the total capacity of the battery in the current situation. In step B2, the total capacity of the battery is divided into multiple power levels, and a level of the total battery capacity is from 0% to 100%. A battery capacity corresponding to each percentage point is different. Then, a corresponding battery internal voltage OCV is found according to the battery capacity corresponding to each percentage point, and then the OCV-SOC curve may be generated. For example, the total capacity of the battery is divided into 100 parts, and each 1% power may be one power level. After a new power point is determined, with reference to the OCV-SOC curve saved in the terminal, the determined new power point is compared with the original OCV-SOC curve to find a point whose original power value is closest to that of the new power point, and an OCV corresponding to the closest point is used as an OCV corresponding to the determined new power point, so that a mapping relationship between the two is established, and a new OCV-SOC curve may be generated.

104. Display the battery power according to the generated OCV-SOC curve.

In this embodiment of the present invention, the battery power is displayed according to the generated OCV-SOC curve, and the generated OCV-SOC curve is generated according to total power stored in the battery in the current situation and therefore can indicate a current actual capacity of the battery, so that correct battery power can be displayed to a terminal user.

It should be noted that the method provided in this embodiment of the present invention may further include the following steps. acquiring a temperature parameter of the battery when the battery is in a charging process, and after generating the OCV-SOC curve according to the acquired power stored in the battery and the acquired OCV, using the generated OCV-SOC curve to replace an OCV-SOC curve that is saved in a terminal to which the battery belongs and corresponding to the temperature parameter.

It should be noted that multiple OCV-SOC curves are set in the terminal according to different temperatures of the terminal. For example, an OCV-SOC curve is corresponding to a normal temperature (a temperature range may be from 0 degrees to 20 degrees) state, and another OCV-SOC curve is corresponding to a high temperature (a temperature range may be around 40 degrees). In this embodiment of the present invention, when the OCV-SOC curve saved in the terminal is replaced by using a newly generated OCV-SOC curve, a temperature parameter of the terminal in a state of newly generating the OCV-SOC curve needs to be considered. Then, the OCV-SOC curve that is saved in the terminal and corresponding to the temperature parameter is replaced by using the newly generated OCV-SOC curve.

In this embodiment provided in the present invention, after completing discharging, a battery enters a charging state until charging is completed. In a process from no stored power to fully charged power, a power increase of the battery is acquired according to a preset time interval, power stored in the battery and an OCV are acquired when the acquired power increase of the battery reaches a preset threshold, after the charging is completed, an OCV-SOC curve for a current storage capacity of the battery is generated, and the battery power is displayed by using the generated OCV-SOC curve. According to the method for displaying battery power provided in the embodiment of the present invention, even if the battery is aging, the OCV-SOC curve generated according to the current storage capacity of the battery can still display current battery power correctly without being affected by battery aging, and therefore a deviation of power displaying is not caused.

Figure 2:
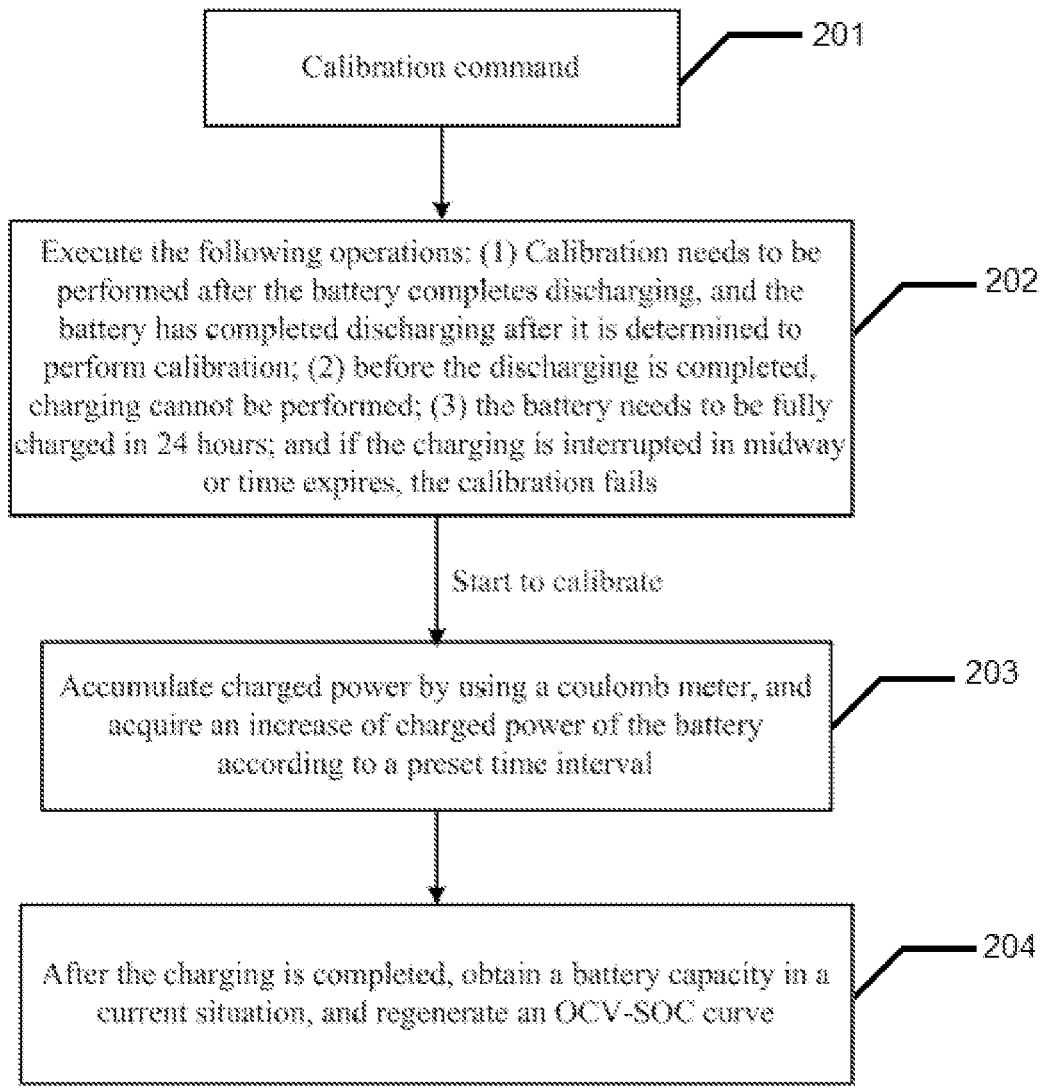
FIG. 2 is a schematic block flowchart of another method for displaying battery power according to an embodiment of the present invention.

The foregoing embodiment describes the method for displaying battery power provided in the embodiment of the present invention, and the following describes a practical application scenario in detail. Referring to FIG. 2, a battery of a mobile phone terminal is used as an example for description: 201. The terminal sends a calibration command. 202. Execute the following operation content: (1) Calibration needs to be performed after the battery completes discharging, and the battery of the terminal has completed discharging after it is determined to perform calibration; (2) before the discharging is completed, no charger or USB is plugged, which prevents the battery from entering a charging state; and (3) after the discharging is completed, charging needs to be performed, and battery charging is completed in 24 hours; and if the charging is interrupted in midway or time expires, the calibration fails. 203. After calibration is started, the battery enters the charging state. In this process, a coulomb meter keeps in a working process, and an increase of charged power of the battery is acquired according to a preset time interval. 204. Each time when the charged power increases by 3 mAh, power stored in the battery at this time is acquired once, and an acquired result is saved, for example, content in Table 1 in the following is obtained. When a voltage of the charged battery reaches 4.2V, it indicates that the charging for the battery is completed. A new OCV-SOC curve is calculated according to saved data.

Table 1 is a data collection table of acquired battery power

| Power | Vbat Voltage | Charging Current | Internal Resistance | OCV Voltage | Temperature |
|---|---|---|---|---|---|
| 3 mAh | Vbat1 | I1 | R1 | OCV1 | 23☐ |
| 6 mAh | Vbat2 | I2 | | OCV2 | |
| 9 mAh | Vbat3 | I3 | | OCV3 | |
| ⇓ | ⇓ | ⇓ | | ⇓ | |
| 99 mAh | Vbat33 | I33 | | OCV33 | |
| 102 mAh | Vbat34 | I34 | R2 | OCV34 | 28☐ |
| ⇓ | ⇓ | ⇓ | | ⇓ | |

| Power | Vbat Voltage | Charging Current | Internal Resistance | OCV Voltage | Temperature |
|---|---|---|---|---|---|
| 198 mAh | Vbat66 | I66 | | OCV66 | |

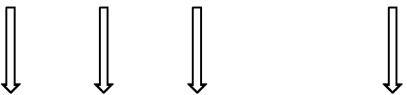

Internal resistance is separately calculated by using records of every 33 times. A charging current is changed, and R1 is calculated according to an original power calculation formula.

According to a newly obtained power value, each 1% power is recalculated according to power division. After a new power point is determined, the determined new power point is compared with an original OCV-SOC curve to find a closest power value. An OCV value corresponding to the closest power value is used as an OCV value corresponding to the new power point, and a mapping relationship is established between the new power point and the corresponding OCV value and, correspondingly, an OCV-SOC curve is obtained. According to information of a temperature, a OCV-SOC curve that is saved in the terminal and corresponding to the temperature is replaced. After the charging is completed, battery power accumulated in the coulomb meter is a total capacity of an aging battery at this time. So far, calibration of the aging battery is completed. An OCV-SOC curve parameter and a battery capacity parameter are updated, and display calibration of the aging battery is completed.

It can be seen that after completing discharging, a battery enters a charging state until charging is completed. In a process from no stored power to fully charged power, multiple power increases of the battery are acquired; power stored in the battery and an OCV are acquired when the acquired power increase of the battery reaches a preset threshold. After the charging is completed, an OCV-SOC curve for a current storage capacity of the battery is generated, and the battery power is displayed by using the generated OCV-SOC curve. Even if the battery is aging, the generated OCV-SOC curve can still display current battery power correctly without being affected by battery aging, and therefore a deviation of power displaying is not caused.

Figure 3:
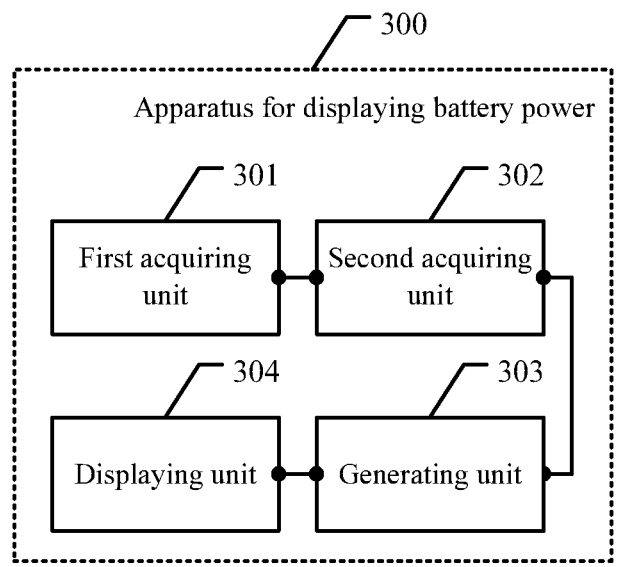
FIG. 3 is a schematic structural diagram of a terminal for displaying battery power according to an embodiment of the present invention.

The foregoing embodiment describes the method for displaying battery power provided in the present invention, and the following describes a terminal for displaying battery power provided in an embodiment of the present invention. In a practical application, the terminal for displaying battery power provided in this embodiment of the present invention may specifically be built in a terminal or a management module of a battery, and display of battery power is implemented in a software or hardware integration manner. In this embodiment of the present invention, a terminal corresponding to the method described in the foregoing method embodiment is described. For a specific execution method of each unit, reference may be made to the foregoing method embodiment. Only content of a related unit is described herein; and for specific description, as shown in FIG. 3, a terminal 300 for displaying battery power includes a first acquiring unit 301 configured to acquire a power increase of a battery according to a preset time interval when the battery enters a charging state, where the battery has completed discharging before entering the charging state, a second acquiring unit 302 configured to acquire power stored in the battery and an open circuit voltage OCV at a time when the power increase of the battery acquired by the first acquiring unit reaches a preset threshold, a generating unit 303 configured to when the battery completes charging, generate an OCV-SOC curve according to the power stored in the battery and the OCV that are acquired by the second acquiring unit, and a displaying unit 304 configured to display the battery power according to the OCV-SOC curve generated by the generating unit.

It should be noted that for the second acquiring unit 302, as one of implementable manners, the second acquiring unit 302 may specifically include (not shown in FIG. 3) a detecting subunit configured to detect a voltage and a current of the battery at the time when the acquired power increase of the battery reaches the preset threshold, a first calculating subunit configured to accumulate the power increase of the battery acquired by the first acquiring unit to obtain the power stored in the battery at the time, and a second calculating subunit configured to calculate the OCV of the battery at the time according to the voltage and the current of the battery that are detected by the detecting subunit.

It should be noted that for the generating unit 303, as one of implementable manners, the generating unit 303 may specifically include (not shown in FIG. 3) a third calculating subunit configured to calculate a total capacity of the battery in a current situation according to the power stored in the battery, a dividing subunit configured to divide the total capacity of the battery that is calculated by the third calculating subunit into multiple power levels, and a mapping subunit configured to establish a mapping relationship between each power level obtained by means of division by the dividing subunit and an OCV that is separately corresponding to each power level to generate the OCV-SOC curve.

It should be noted that for the displaying unit 304, as one of implementable manners, the displaying unit 304 is further configured to, if charging is interrupted in midway after the battery enters the charging state or if charging time exceeds a charging time limit, display the battery power by using an OCV-SOC curve saved in a terminal to which the battery belongs.

It should be noted that for the terminal 300 for displaying battery power, as one of implementable manners, the terminal 300 may further include (not shown in FIG. 3) an acquiring unit configured to acquire a temperature parameter of the battery when the battery is in a charging process, and a replacing unit configured to use the OCV-SOC curve generated by the generating unit to replace an OCV-SOC curve that is saved in a terminal to which the battery belongs and corresponding to the temperature parameter.

It should be noted that content such as information exchange between modules/units of the foregoing terminal, and execution procedures are based on the same concept of the method embodiment of the present invention, and technical effects thereof are the same as those of the method embodiment of the present invention. For details, reference may be made to description of the method embodiments of the present invention shown in FIG. 1 and FIG. 2, and details are not described herein again.

In this embodiment provided in the present invention, after completing discharging, a battery enters a charging state until charging is completed. In a process from no stored power to fully charged power, a first acquiring unit acquires a power increase of the battery according to a preset time interval, a second acquiring unit acquires power stored in the battery and an OCV when the acquired power increase of the battery reaches a preset threshold, after the charging is completed, a generating unit generates an OCV-SOC curve for a current storage capacity of the battery, and a displaying unit displays the battery power by using the generated OCV-SOC curve. For terminal power displayed on the terminal for displaying battery power provided in this embodiment of the present invention, even if the battery is aging, the OCV-SOC curve generated according to the current storage capacity of the battery can still display current battery power correctly without being affected by battery aging, and therefore a deviation of power displaying is not caused.

Figure 4:
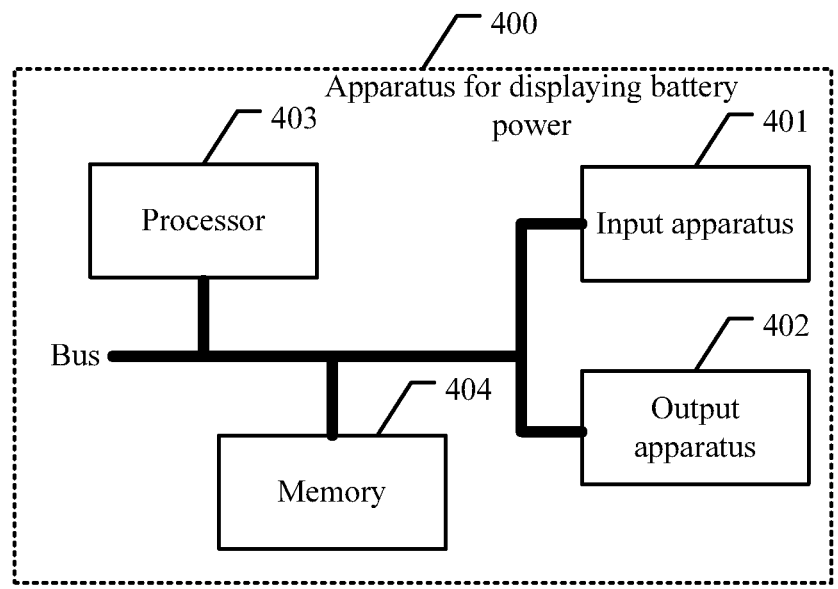
FIG. 4 is a schematic structural diagram of another terminal for displaying battery power according to an embodiment of the present invention.

The following describes another terminal for displaying battery power according to an embodiment of the present invention. Referring to FIG. 4, a terminal 400 for displaying battery power includes an input apparatus 401, an output apparatus 402, a processor 403, and a memory 404 (there may be one or more processors 403 in the displaying terminal 400, and one processor is used as an example in FIG. 4). In some embodiments of the present invention, the input apparatus 401, the output apparatus 402, the processor 403, and the memory 404 may be connected by using a bus or in another manner, and that they are connected by using a bus is used as an example in FIG. 4.

The processor 403 is configured to execute the following steps: acquiring a power increase of a battery according to a preset time interval when the battery enters a charging state, where the battery has completed discharging before entering the charging state, acquiring power stored in the battery and an open circuit voltage OCV of the battery at a time when the acquired power increase of the battery reaches a preset threshold, generating an OCV-SOC curve according to the acquired power stored in the battery and the acquired OCV when the battery completes charging, and displaying the battery power according to the generated OCV-SOC curve.

In some embodiments of the present invention, acquiring the power stored in the battery and the open circuit voltage OCV of the battery at the time when the acquired power increase of the battery reaches the preset threshold may specifically include detecting a voltage and a current of the battery at the time when the acquired power increase of the battery reaches the preset threshold, accumulating the power increase of the battery to obtain the power stored in the battery at the time, and calculating the OCV of the battery at the time according to the voltage and the current of the battery.

In some embodiments of the present invention, that the processor 403 generates the OCV-SOC curve according to the acquired power stored in the battery and the acquired OCV may specifically include calculating a total capacity of the battery in a current situation according to the power stored in the battery, dividing the total capacity of the battery into multiple power levels, and establishing a mapping relationship between each power level and an OCV that is separately corresponding to each power level to generate the OCV-SOC curve.

In some embodiments of the present invention, the processor 403 may further be configured to execute the following step: if charging is interrupted in midway after the battery enters the charging state or if charging time exceeds a charging time limit, displaying the battery power by using an OCV-SOC curve saved in a terminal to which the battery belongs.

In some embodiments of the present invention, the processor 403 may further be configured to execute the following steps: acquiring a temperature parameter of the battery when the battery is in a charging process, and after generating the OCV-SOC curve according to the acquired power stored in the battery and the acquired OCV, using the generated OCV-SOC curve to replace an OCV-SOC curve that is saved in a terminal to which the battery belongs and corresponding to the temperature parameter.

In this embodiment provided in the present invention, after completing discharging, a battery enters a charging state until charging is completed. In a process from no stored power to fully charged power, a processor acquires a power increase of the battery according to a preset time interval, the processor acquires power stored in the battery and an OCV when the acquired power increase of the battery reaches a preset threshold, after the charging is completed, the processor generates an OCV-SOC curve for a current storage capacity of the battery, and the processor displays the battery power by using the generated OCV-SOC curve. According to the method for displaying battery power provided in the embodiment of the present invention, even if the battery is aging, the OCV-SOC curve generated according to the current storage capacity of the battery can still display current battery power correctly without being affected by battery aging, and therefore a deviation of power displaying is not caused.

A person of ordinary skill in the art may understand that all or a part of the steps of the methods in the foregoing embodiments may be implemented by a program instructing relevant hardware. The program may be stored in a computer readable storage medium. The storage medium may include a read-only memory, a magnetic disk, or an optical disc.

The method and the related terminal for displaying battery power that are provided in the present invention are described in detail in the foregoing, and a person of ordinary skill in the art may make variations to specific implementation manners and application scopes according to the ideas of the embodiments of the present invention. In conclusion, the content of this specification shall not be understood as a limitation on the present invention.

What is claimed is:

1. A method for displaying battery power, comprising:
receiving charging current at a battery between a first time at which the battery is fully discharged and a second time at which the battery is fully charged, wherein the charging current charges the battery, and the battery is charged without interruption between the first time and the second time;
determining, while the battery is receiving the charging current between the first time and the second time, a power increase of the battery at a first plurality of times according to a preset time interval;
detecting, at a second plurality of the first plurality of times and while the battery is receiving the charging current between the first time and the second time, a power stored in the battery, a voltage of the battery, and a current of the battery, the second plurality of times corresponding to each time, of the first plurality of times, at which the power increase of the battery reaches a preset threshold;
responsive to completing charging of the battery without interruption of the charging between the first time and the second time, determining open circuit voltages (OCVs) of the battery based on the voltage of the battery and the current of the battery detected at the second plurality of times;

calculating a total capacity of the battery according to the power stored in the battery when the battery completes charging;

generating, when the battery completes charging at the second time without interruption of the charging between the first time and the second time, an Open Circuit Voltage-State Of Capacity (OCV-SOC) curve according to the total capacity of the battery, the power stored in the battery that is detected at the second plurality of times, and the OCVs determined based on the voltage of the battery and the current of the battery detected at the second plurality of times and while the battery is charging; and displaying a battery power that is derived from the generated OCV-SOC curve.

2. The method of claim 1, wherein the power stored in the battery is detected using a coulomb meter.

3. The method of claim 1, wherein generating the OCV-SOC curve comprises:
dividing the total capacity of the battery into multiple power levels; and
establishing a mapping relationship between each of the multiple power levels and a respective OCV of the power level to generate the OCV-SOC curve.

4. The method of claim 1, wherein the method further comprises:
acquiring a temperature parameter of the battery between the first time and the second time; and
after generating the OCV-SOC curve, using the generated OCV-SOC curve to replace a second OCV-SOC curve that is saved in a terminal to which the battery belongs, wherein the second OCV-SOC curve corresponds to the temperature parameter.

5. The method of claim 1, wherein detecting the voltage of the battery and the current of the battery at the second plurality of times comprises detecting a second voltage of the battery and a second current of the battery at a fourth time between the first and second times and following a third time at which a first voltage of the battery and a first current of the battery are detected, the third time is between the first time and the second time, and the method further comprises determining an internal resistance of the battery based the first voltage, the first current, the second voltage, and the second current.

6. The method claim 5, wherein determining the OCVs includes determining a first OCV for the third time based on the first voltage, the first current, and the determined internal resistance.

7. A terminal, comprising:
a battery configured to store power;
a processor coupled to the battery and configured to:
acquire, while the battery is being charged without interruption between a first time at which the battery is fully discharged and a second time at which the battery is fully charged, a power increase of the battery at a first plurality of times between the first time and the second time according to a preset time interval;
acquire, at a second plurality of the first plurality of times and while the battery is being charged between the first time and the second time, the power stored in the battery, a voltage of the battery, and a current of the battery, the second plurality of times corresponding to each time, of the first plurality of times, at which the power increase of the battery reaches a preset threshold;

responsive to completing charging of the battery without interruption of the charging between the first time and the second time, determine open circuit voltages (OCVs) of the battery based on the voltage of the battery and the current of the battery acquired at the second plurality of times;

calculate a total capacity of the battery according to the power stored in the battery when the battery completes charging;

generate, when the battery completes charging at the second time without interruption of the charging between the first time and the second time, an Open Circuit Voltage-State Of Capacity (OCV-SOC) curve according to the total capacity of the battery, the power stored in the battery that is acquired at the second plurality of times, and the OCVs determined based on the voltage of the battery and the current of the battery acquired at the second plurality of times and while the battery is charging; and a display coupled to the processor and configured to display a battery power that is derived from the OCV-SOC curve.

8. The terminal of claim 7, further comprising a coulomb meter configured to determine the power increase of the battery at the first plurality of times according to the preset time interval, wherein the processor is configured to acquire the power increase at the first plurality of times from the coulomb meter.

9. The terminal of claim 7, wherein, to generate the OCV-SOC curve, the processor is configured to:
divide the total capacity of the battery into multiple power levels; and
establish a mapping relationship between each of the multiple power levels and a respective OCV of the power level to generate the OCV-SOC curve.

10. The terminal of claim 7, wherein the processor is further configured to:
acquire a temperature parameter of the battery between the first time and the second time; and
use the generated OCV-SOC curve to replace a second OCV-SOC curve that is saved in the terminal, wherein the second OCV-SOC curve corresponds to the temperature parameter.

11. The terminal of claim 7, wherein the processor is configured to acquire the voltage of the battery and the current of the battery at the second plurality of times by being configured to detect a second voltage of the battery and a second current of the battery at a fourth time between the first and second times and following a third time at which a first voltage of the battery and a first current of the battery are detected, the third time is between the first time and the second time, and the processor is further configured to determine an internal resistance of the battery based the first voltage, the first current, the second voltage, and the second current.

12. The terminal of claim 11, wherein the processor is further configured to determine the OCVs by being configured to determine a first OCV for the third time based on the first voltage, the first current, and the determined internal resistance.

13. A computer readable storage medium storing a program that, when executed by a computer, causes the computer to:
receive charging current at a battery between a first time at which the battery is fully discharged and a second time at which the battery is fully charged, wherein the charging current charges the battery, and the battery is charged without interruption between the first time and the second time;

determine, while the battery is receiving the charging current between the first time and the second time, a power increase of the battery at a first plurality of times according to a preset time interval;

detect, at a second plurality of the first plurality of times and while the battery is receiving the charging current between the first time and the second time, a power stored in the battery, a voltage of the battery, and a current of the battery, the second plurality of times corresponding to each time, of the first plurality of times, at which the power increase of the battery reaches a preset threshold;

responsive to completing charging of the battery without interruption of the charging between the first time and the second time, determine open circuit voltages (OCVs) of the battery based on the voltage of the battery and the current of the battery detected at the second plurality of times;

calculate a total capacity of the battery according to the power stored in the battery when the battery completes charging;

generate, when the battery completes charging at the second time without interruption of the charging between the first time and the second time, an Open Circuit Voltage-State Of Capacity (OCV-SOC) curve according to the total capacity of the battery, the power stored in the battery that is detected at the second plurality of times, and the OCVs determined based on the voltage of the battery and the current of the battery detected at the second plurality of times and while the battery is charging; and cause a display to display a battery power that is derived from the generated OCV-SOC curve.

* * * * *